(12) United States Patent
Sommer et al.

(10) Patent No.: US 12,111,373 B2
(45) Date of Patent: Oct. 8, 2024

(54) DETERMINATION OF A FURTHER PROCESSING LOCATION IN MAGNETIC RESONANCE IMAGING

(71) Applicant: KONINKLIJKE PHILIPS N.V., Eindhoven (NL)

(72) Inventors: Karsten Sommer, Hamburg (DE); Michael Gunter Helle, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 658 days.

(21) Appl. No.: 17/294,698

(22) PCT Filed: Nov. 19, 2019

(86) PCT No.: PCT/EP2019/081797
§ 371 (c)(1),
(2) Date: May 18, 2021

(87) PCT Pub. No.: WO2020/104455
PCT Pub. Date: May 28, 2020

(65) Prior Publication Data
US 2022/0012876 A1    Jan. 13, 2022

(30) Foreign Application Priority Data
Nov. 20, 2018 (EP) .................................. 18207254

(51) Int. Cl.
*G01R 33/54* (2006.01)
*G01R 33/56* (2006.01)
(Continued)

(52) U.S. Cl.
CPC ......... *G01R 33/543* (2013.01); *G01R 33/546* (2013.01); *G01R 33/5608* (2013.01);
(Continued)

(58) Field of Classification Search
None
See application file for complete search history.

(56) References Cited

U.S. PATENT DOCUMENTS

2014/0153804 A1\* 6/2014 Jattke .................... G06T 7/0012
382/131
2014/0232725 A1   8/2014 Hara
(Continued)

FOREIGN PATENT DOCUMENTS

CN   103845056 A * 6/2014 ........... G06T 7/0012
JP       824227 A    1/1996
(Continued)

OTHER PUBLICATIONS

Erhan et al "Scalable Object Detection Using Deep Neural Networks" 2014 IEEE Conf. on Computer Vision and Pattern Recognition, Jun. 1, 2014 p. 2155-2162.
(Continued)

*Primary Examiner* — Mohammed Rachedine

(57) ABSTRACT

The invention provides for a method of training a neural network (322) configured for providing a further processing location (326). The method comprises providing (200) a labeled medical image (100), wherein the labeled medical image comprises multiple labels each indicating a truth processing location (102, 104, 106). The method further comprises inputting (202) the labeled medical image into the neural network to obtain one trial processing location. The one trial processing location comprises a most likely trial processing location (108). The method further comprises determine (204) the closest truth processing location (106) for the most likely trial processing location. The method further comprises calculating (206) an error vector (110) using the closest truth processing location and the most likely trial processing location. The method further com-
(Continued)

prises training (208) the neural network using the error vector.

20 Claims, 8 Drawing Sheets

(51) Int. Cl.
G01R 33/563 (2006.01)
G06N 3/045 (2023.01)
G06N 3/084 (2023.01)
G06T 7/00 (2017.01)
G06V 10/764 (2022.01)
G06V 10/82 (2022.01)

(52) U.S. Cl.
CPC . *G01R 33/56308* (2013.01); *G01R 33/56366* (2013.01); *G06T 7/0012* (2013.01); *G06V 10/764* (2022.01); *G06V 10/82* (2022.01); G06T 2207/10096 (2013.01); G06T 2207/20081 (2013.01); G06T 2207/20084 (2013.01); G06T 2207/20101 (2013.01); G06T 2207/30016 (2013.01)

(56) References Cited

U.S. PATENT DOCUMENTS

| | | | | |
|---|---|---|---|---|
| 2014/0300353 A1* | 10/2014 | He | ............ | G01R 33/485 324/309 |
| 2017/0299677 A1* | 10/2017 | Dimitrov | ............ | A61B 5/055 |
| 2018/0203081 A1 | 7/2018 | Cohen | | |

FOREIGN PATENT DOCUMENTS

| | | | |
|---|---|---|---|
| WO | 2017106469 A1 | 6/2017 | |
| WO | 2017192629 A1 | 11/2017 | |

OTHER PUBLICATIONS

C. Szegedy et al "Scalable, High Quality Object Detection" vol. 1412,1441 V2., Feb. 26, 2015 p. 1-9.
Wang et al "Interactive Medical Image Segmenation Using Deep-Learning With Image-Specific Fine Tuning" Oct. 11, 2017, Cornell Univeristy Library.
D. Alsop, et al., "Recommended implementation of arterial spin-labeled perfusion MRI for clinical applications: A consensus of the ISMRM perfusion study group and the European consortium for ASL in dementia" Magn Res Med 73:102-116, 2015.
M. Helle, et al., "Superselective Pseudocontinuous Arterial Spin Labeling" Magn Reson Med 64:777-786, 2010.
A. Krizhevsky, et al., "ImageNet classification with deep convolutional neural networks" Adv Neural Inf Process Syst, 2012.
N. Vincent et al "Detection of Hyperfusion on Arterial Spin Labeling Using Deep Learning" 2015 IEEE International Conf. of Bio-informatics and Biomedicine.
Kim et al "Improving Arterial Spin Labeling by Using Deep Learning" Radiology vol. 287 May 2018.
Zhu et al "Patch Based Local Learning Method for Cerebral Blood Flow Quantification With Arterial Spin-Labeling MRI" Med. Biol. Eng. Compu. 2018.
International Search Report and Written Opinion from PCT/EP2019/081797 mailed May 28, 2020.

* cited by examiner

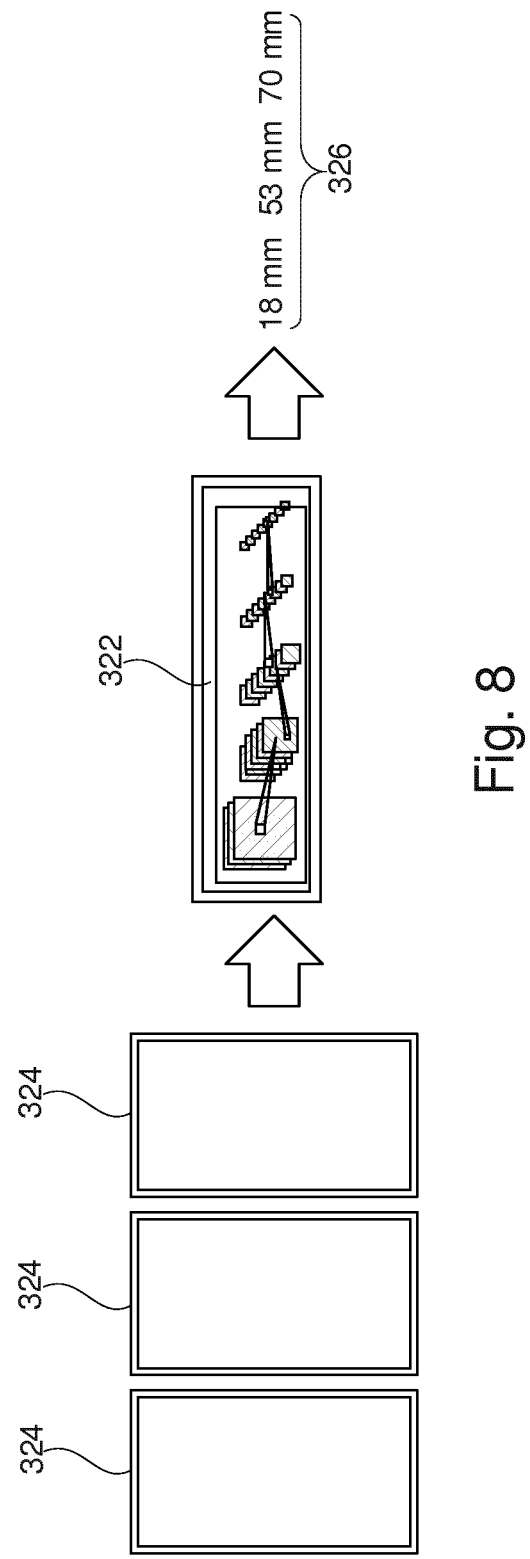

DETERMINATION OF A FURTHER PROCESSING LOCATION IN MAGNETIC RESONANCE IMAGING

CROSS REFERENCE TO RELATED APPLICATIONS

This application is a U.S. national phase application of International Application No. PCT/EP2019/081797 filed on Nov. 19, 2019, which claims the benefit of EP Application Serial No. 18207254.6 filed on Nov. 20, 2018 and is incorporated herein by reference.

FIELD OF THE INVENTION

The invention relates to magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a subject. This large static magnetic field is referred to as the B0 field or the main magnetic field. Various quantities or properties of the subject can be measured spatially using MRI. Various imaging protocols can be implemented by using pulse sequences to control the acquisition of magnetic resonance data. In the design of these pulse sequences there are typically a large number of adjustable image acquisition parameters. In some cases, operator makes an initial or survey scan and uses this to determine locations which are used to modify subsequent image acquisitions.

International patent application WO 2017/106469 A1 discloses systems and methods for analyzing perfusion-weighted medical imaging using deep neural networks are provided. The method includes receiving perfusion-weighted imaging data acquired from a subject using a magnetic resonance ("MR") imaging system and modeling at least one voxel associated with the perfusion-weighted imaging data using a four-dimensional ("4D") convolutional neural network. The method also includes extracting spatio-temporal features for each modeled voxel and estimating at least one perfusion parameter for each modeled voxel based on the extracted spatio-temporal features. The method further includes generating a report using the at least one perfusion parameter indicating perfusion in the subject.

SUMMARY OF THE INVENTION

The invention provides for a method, a medical imaging system, and a computer program product in the independent claims. Embodiments are given in the dependent claims.

Embodiments may provide for a means of automatically performing complicated magnetic resonance imaging techniques. This may be accomplished by using a neural network that has been specially trained. In some imaging techniques such as Arterial Spin Labeling (ASL) blood in individual or multiple arteries are labeled magnetically. A difficulty in automating this task is that there may be several acceptable spatial locations for the labeling volume or plane.

To train the neural network to do this, the normal training procedure is modified. Labeled medical images are provided which have more than one correct location labeled. These are referred to as truth processing locations. To train the neural network, the labelled medical image is first input into the neural network. This results in a trial processing location being output. To calculate the error vector to train the neural network, the truth processing location closest to the trial processing location is selected. This closest processing location and the trial processing location are then used to train the neural network. This enables the training procedure to robustly find an improved trial processing location. Once the training procedure is completed, the trial processing locations can be used to automate magnetic resonance imaging protocols.

In one aspect the invention provides for a method of training a neural network configured for providing a processing location. The method comprises providing a labeled medical image. The labeled medical image comprises multiple labels each indicating a truth processing location. The truth processing location as used herein encompasses a processing location, multiple processing locations, or a range of processing locations which are regarded or considered to be correct. The method further comprises inputting the labeled medical image into a neural network to obtain at least one trial processing location. The at least one trial processing location comprises a most likely trial processing location. The method further comprises determining the closest truth processing location for the most likely trial processing location.

For example, the multiple truth processing locations may be distributed in different positions or include a range of multiple different positions in the medical image. The closest truth processing location is the closest of the truth processing locations to the output of the neural network. The method further comprises calculating an error vector using the closest truth processing location and the most likely trial processing location. In different embodiments this could take different forms. The vector could indicate a size and/or position change so that the trial processing location is either within or the same as the truth processing location. The method further comprises training the neural network using the error vector. The training may for example be performed using deep learning when the neural network is a convolutional neural network.

This embodiment may be beneficial because it provides a means of training a neural network when there are multiple correct solutions. This may be useful in various types of medical imaging procedures. For example, in arterial spin labeling a labeling volume, a labeling plane, or labeling spots for a single artery is chosen. However, there is a certain degree of freedom in choosing the proper labeling volume for arterial spin labeling. For this particular example when constructing the labeled medical image, a human or other user could label a number of different volumes as being acceptable for the labeling volume. These would all then be individual truth processing locations. The neural network could then take the labeled image and output the at least one trial processing location. The most likely of these trial processing locations can then be compared to the various labeling volumes which were placed on the medical image. The error vector can be constructed such that the most likely trial processing location is transformed to the closest spin labeling volume. This may for example enable the training of a neural network to perform a task which is typically done by a human in a robust manner.

In another embodiment the method is performed repeatedly using multiple labeled medical images. This may be advantageous because as the neural network is trained more the ability of the neural network to properly place the processing location increases.

In another embodiment the error vector is calculated only using the closest truth processing location and the most likely trial processing location.

In another embodiment at least one of the multiple labeled medical images has only a single label that indicates the correct bounding box. For example, when training the neural network, it is also possible that in some individual images there will only be one bounding box. The number of bounding boxes which indicate trial processing locations may therefore be variable.

As used herein a trial processing location may be related to a bounding box. A bounding box may be an identification of a volume or region of an image or medical image.

In another aspect the invention provides for a medical imaging system that comprises a memory for storing machine-executable instructions and a neural network trained according to an embodiment. The neural network may for example be a convolutional neural network.

The medical imaging system further comprises a processor for controlling the machine-executable instructions. Execution of the machine-executable instructions causes the processor to receive a medical image. Execution of the machine-executable instructions further cause the processor to input the medical image into the neural network. The neural network then provides the further processing location in response to this input.

The further processing location may take different forms in different examples or embodiments. In one example the further processing location is a region which is used to modify or control a further magnetic resonance imaging procedure or protocol. In other examples the further processing location may be used as an input for controlling a numerical algorithm for analyzing or modifying a medical image.

In another embodiment the medical imaging system further comprises a magnetic resonance imaging system. The memory further comprises pulse sequence commands configured for controlling the magnetic resonance imaging system to acquire magnetic resonance imaging data according to a magnetic resonance imaging protocol. Execution of the machine-executable instructions further cause the processor to modify the pulse sequence commands using the further processing location. For example, if the pulse sequence commands control the magnetic resonance imaging system to perform arterial spin labeling then the further processing location may for example be a labeling volume. Execution of the machine-executable instructions further cause the processor to acquire the magnetic resonance imaging data by controlling the magnetic resonance imaging system with the modified pulse sequence commands. Execution of the machine-executable instructions further cause the processor to reconstruct a magnetic resonance image using the magnetic resonance imaging data according to the magnetic resonance imaging protocol. This embodiment may be beneficial because it may provide a means of automating the acquisition and reconstruction of the magnetic resonance image. Using the example of arterial spin labeling again this may save the operator or user of the system from having to manually select labeling volumes.

In another embodiment the memory further comprises initial pulse sequence commands configured for controlling the magnetic resonance imaging system to acquire initial magnetic resonance imaging data. Execution of the machine-executable instructions further cause the processor to control the magnetic resonance imaging system to acquire the initial magnetic resonance imaging data using the initial pulse sequence commands. Execution of the machine-executable instructions further causes the processor to reconstruct the medical image using the initial magnetic resonance imaging data. This may for example also help to enable the fully automated acquisition and imaging of magnetic resonance images in complex magnetic resonance imaging protocols. The magnetic resonance imaging may for example obtain a low resolution or a survey scan and use this as input into the neural network. The neural network then outputs the further processing location which is used to modify the pulse sequence commands and then in an automated fashion acquire and then reconstruct the magnetic resonance image.

In another embodiment the magnetic resonance imaging protocol is an arterial spin labeling protocol. The further processing region is a labeling location. A labeling location is a region which blood flows through and is labeled during the arterial spin labeling protocol.

This embodiment may be beneficial because it may provide for a means of automating an arterial spin labeling protocol.

In another embodiment the magnetic resonance imaging protocol is a dynamic contrast enhanced magnetic resonance imaging protocol or a dynamic susceptibility contrast magnetic resonance imaging protocol. The further processing region is a measurement location for the arterial input function.

In another embodiment the magnetic resonance imaging protocol is a single-voxel magnetic resonance spectroscopy protocol. The further processing region is a single-voxel location for performing the single-voxel magnetic resonance spectroscopy protocol.

In another embodiment the magnetic resonance imaging protocol is a phase-contrast magnetic resonance imaging protocol. The further processing region is a slice position for performing the phase-contrast magnetic resonance imaging protocol.

In another embodiment the magnetic resonance imaging protocol is a contrast-enhanced magnetic resonance angiography protocol. The further processing region is a temporal region for triggering acquisition of the magnetic resonance imaging data. In this embodiment the further processing region is essentially a signal and the further processing region is a temporal time where the magnetic resonance imaging data is acquired.

In another embodiment the medical image is a diffusion weighted magnetic resonance image of the brain. The further processing region is a seed point and/or a region of interest size selection. Execution of the machine-executable instructions further causes the processor to calculate a brain fiber tracking image by inputting the further processing region and the medical image into a brain fiber tracking algorithm. This embodiment may be beneficial because it provides a means for automating the starting and running of the brain fiber tracking algorithm.

In another embodiment execution of the machine-executable instructions further causes the processor to display the medical image on the user interface. Execution of the machine-executable instructions further cause the processor to receiving multiple labels each indicating a truth processing location. Execution of the machine-executable instructions further cause the processor to train the neural network by first providing a further labeled medical image. The further labeled medical image comprises further multiple labels each indicating a further truth processing location. Execution of the machine-executable instructions further cause the processor to train the neural network by inputting the further labeled medical image into the neural network to obtain the at least one further trial processing location. The at least one further trial processing location comprises a further most likely trial processing location. Execution of the machine-executable instructions further cause the processor to train the neural network by determining the further closest truth processing location for the further most likely trial processing location. Execution of the machine-executable instructions further cause the processor to train the neural network by calculating a further error vector using the further closest truth processing location and the further most likely trial processing location. Execution of the machine-executable instructions further cause the processor to train the neural network by training the neural network using the error vector.

The at least one further trial processing location comprises a further and most likely trial processing location. The method of training the neural network is thoroughly performed by determining the further closest truth processing location for the further most likely trial processing location. The training of the neural network is finally further performed by training the neural network using the error vector. This embodiment may be beneficial because it may provide for a means of continually upgrading the performance of the neural network during use.

In a further aspect the invention provides for a computer program product comprising machine-executable instructions for execution by a processor controlling the medical imaging system. Execution of the machine-executable instructions causes the processor to receive a labeled medical image. The labeled medical image comprises multiple labels each indicating a truth processing location. Execution of the machine-executable instructions further causes the processor to input the labeled medical image into a neural network to obtain the at least one trial processing location. The at least one trial processing location comprises a most likely trial processing location. Execution of the machine-executable instructions further causes the processor to determine the closest truth processing location for the most likely trial processing location. Execution of the machine-executable instructions further causes the processor to calculate an error vector using the closest truth processing location and the most likely trial processing location. Execution of the machine-executable instructions further causes the processor to train the neural network using the error vector.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. MRF magnetic resonance data is magnetic resonance data. Magnetic resonance data is an example of medical image data. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which:

FIG. 8 illustrates an example of using a neural network to place a further processing volume on a medical image.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
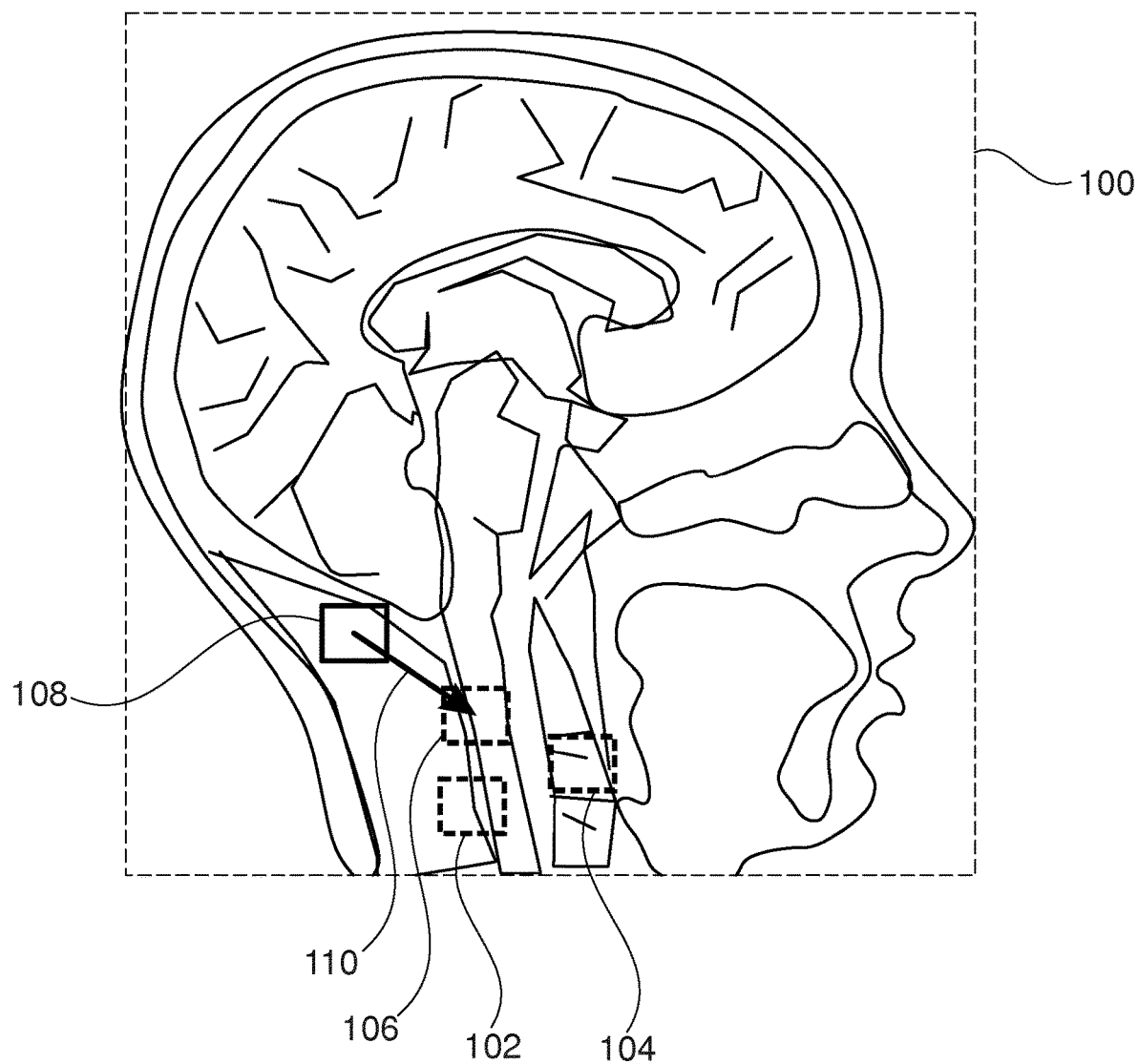
FIG. 1 illustrates an example of a medical image.

FIG. 1 represents a labeled medical image 100. The labeled medical image 100 may for example be a magnetic resonance image. Within the labeled medical image are multiple labels 102, 104, 106 which each represent truth processing locations. The box 108 shows the location of a most likely trial processing location which is output when the labeled medical image 100 is input into a neural network. It can be seen that the most likely trial processing location 108 does not correspond to any of the truth processing locations 102, 104, 106. However, the truth processing location 106 is closest to the most likely trial processing location 108. The difference can be represented as an error vector 110. The error vector 110 can then be used to train the neural network.

Figure 2:
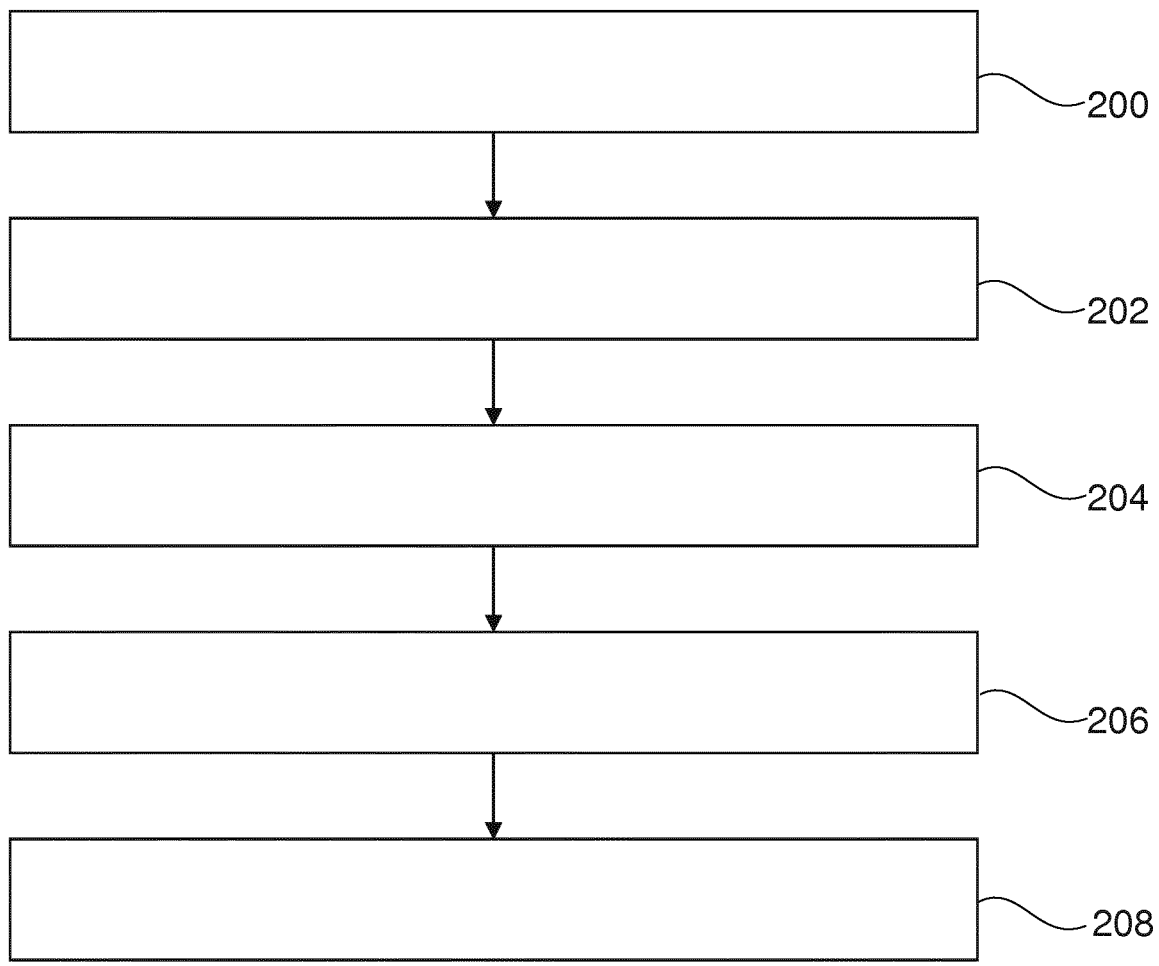
FIG. 2 shows a flow chart which illustrates a method of training a neural network.

FIG. 2 shows a flowchart which illustrates a method of training a neural network. First in step 200 the labeled medical image 100 is provided. The labeled medical image comprises multiple labels 102, 104, 106 which each represent a truth processing location. Next in step 202 the labeled medical image 100 is input into a neural network to obtain at least one trial processing location. The at least one trial processing location comprises a most likely trial processing location 108. Next in step 204 the closest truth processing location 106 is determined for the most likely trial processing location 108. Next in step 206 the error vector 110 is calculated using the position of the closest truth processing location 106 and the most likely trial processing location 108. Finally, in step 108 the neural network is trained using the error vector 110.

Figure 3:
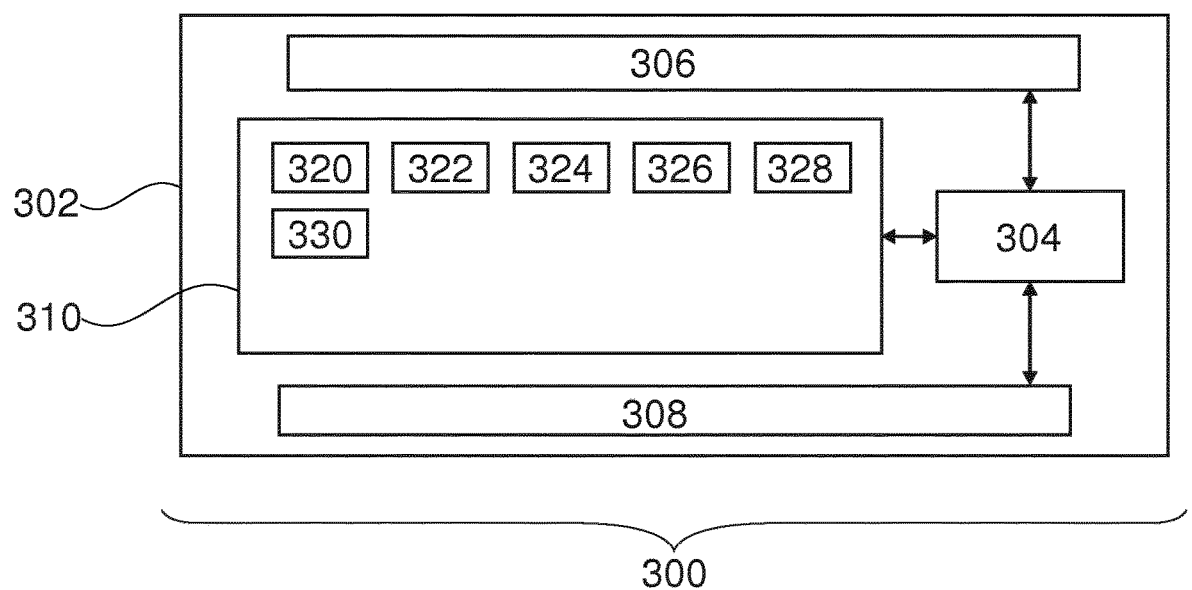
FIG. 3 illustrates an example of a medical imaging system.

FIG. 3 illustrates an example of a medical imaging system 300. The medical imaging system 300 in this example comprises a computer 302. The computer 302 comprises a processor 304 that is optionally connected to a hardware interface and optionally connected to a user interface 308. The optional hardware interface 306 may enable the processor 304 to communicate with other computers and also to control the operation and function of other components of the medical imaging system 300. The optional user interface 308 may enable the processor 304 to display data and also to receive instructions and commands from a user. The processor 304 is shown as being connected to a memory 310.

The memory 310 may be any combination of memory which is accessible to the processor 304. This may include such things as main memory, cached memory, and also non-volatile memory such as flash RAM, hard drives, or other storage devices. In some examples the memory 304 may be considered to be a non-transitory computer-readable medium.

The memory 310 is shown as containing machine-executable instructions 320 that may enable the processor 304 to control the operation and function of other components of the medical imaging system 300 as well as to perform various algorithmic and image processing functions. The memory 310 is further shown as containing a neural network 322 that has been trained according to an example or an embodiment. The memory 310 is further shown as containing a medical image 324. In some examples the medical image 324 may be a magnetic resonance image. The medical image 324 is input into the neural network 322 and as an output a further processing location 326 is received. The further processing location 326 may be used by the processor 304 to modify the function of the medical imaging system 300. For example, in some instances the further processing location 326 may be used to control a further or subsequent magnetic resonance imaging acquisition and imaging protocol.

In other examples the further processing location 326 may be used to initiate or control a numerical algorithm. As an example, the memory 310 is shown as containing an optional brain fiber tracking algorithm 328 that can be used in diffusion tensor imaging magnetic resonance imaging to calculate a brain fiber tracking image. The memory 310 is further shown as containing an optional brain fiber tracking image that resulted from using the further processing location 326 and the medical image 324 as input to the optional brain fiber tracking algorithm 328.

Figure 4:
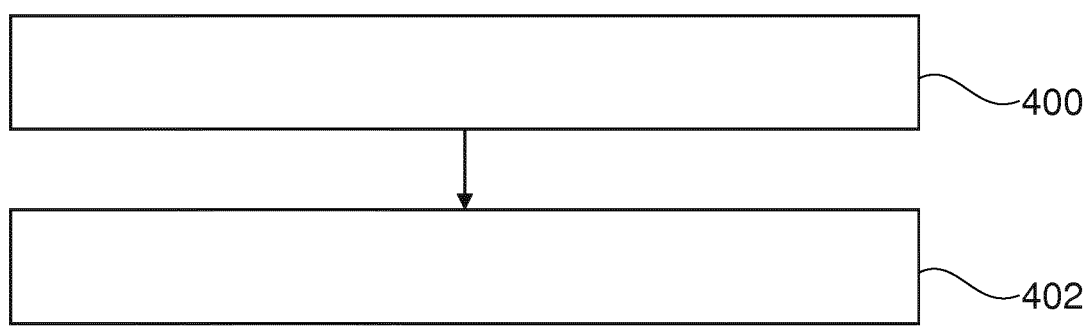
FIG. 4 shows a flow chart which illustrates a method of operating the medical imaging system of FIG. 3.

FIG. 4 shows a flowchart which illustrates a method of operating the medical imaging system 300 of FIG. 3. First in step 400 the medical image 324 is received. Next in step 402 the medical image 324 is input into the neural network 322 and the further processing location 326 is received. After the method of FIG. 4 has been performed a variety of different operations may be performed. For example, the further processing location 326 may be used for controlling a magnetic resonance imaging system for a further acquisition. In other examples it may be used for controlling the behavior of a numerical algorithm such as the brain fiber tracking algorithm 328 illustrated in FIG. 3.

Figure 5:
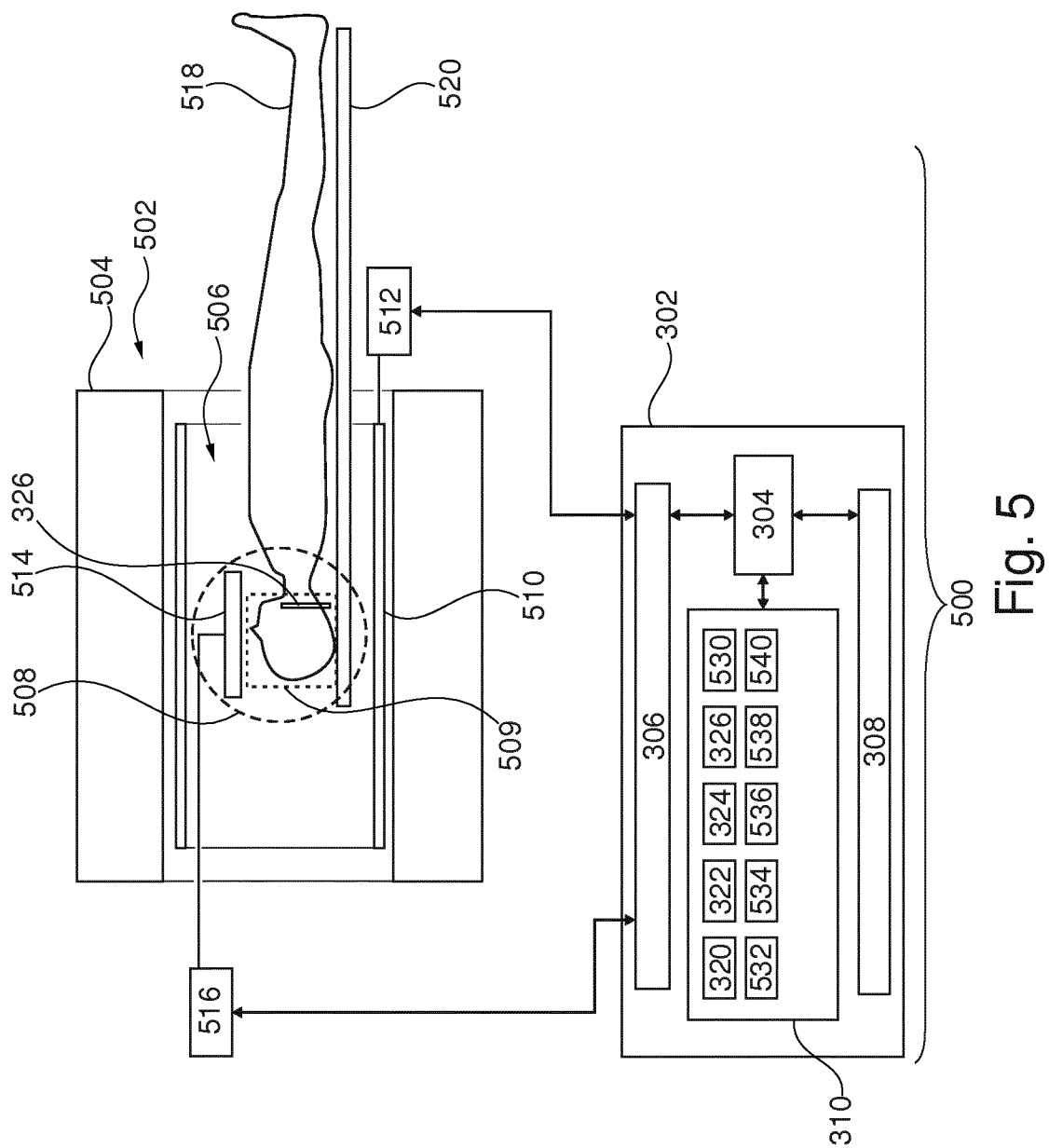
FIG. 5 illustrates a further example of a medical imaging system.

FIG. 5 illustrates a further example of a medical imaging system 500. In this example the medical imaging system 500 comprises a magnetic resonance imaging system 502 with a magnet 504. The magnet 504 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 506 of the cylindrical magnet 504 there is an imaging zone 508 where the magnetic field is strong and uniform enough to perform magnetic resonance imaging. A region of interest 509 is shown within the imaging zone 508. The magnetic resonance data that is acquired typically acquired for the region of interest. A subject 518 is shown as being supported by a subject support 520 such that at least a portion of the subject 518 is within the imaging zone 508 and the region of interest 509.

Within the bore 506 of the magnet there is also a set of magnetic field gradient coils 510 which is used for acquisition of preliminary magnetic resonance data to spatially encode magnetic spins within the imaging zone 508 of the magnet 504. The magnetic field gradient coils 510 connected to a magnetic field gradient coil power supply 512. The magnetic field gradient coils 510 are intended to be representative. Typically magnetic field gradient coils 510 contain three separate sets of coils for spatially encoding in three orthogonal spatial directions. A magnetic field gradient power supply supplies current to the magnetic field gradient coils. The current supplied to the magnetic field gradient coils 510 is controlled as a function of time and may be ramped or pulsed.

Adjacent to the imaging zone 508 is a radio-frequency coil 514 for manipulating the orientations of magnetic spins within the imaging zone 508 and for receiving radio transmissions from spins also within the imaging zone 508. The radio frequency antenna may contain multiple coil elements. The radio frequency antenna may also be referred to as a channel or antenna. The radio-frequency coil 514 is connected to a radio frequency transceiver 516. The radio-frequency coil 514 and radio frequency transceiver 516 may be replaced by separate transmit and receive coils and a separate transmitter and receiver. It is understood that the radio-frequency coil 514 and the radio frequency transceiver 516 are representative. The radio-frequency coil 514 is intended to also represent a dedicated transmit antenna and a dedicated receive antenna. Likewise the transceiver 516 may also represent a separate transmitter and receivers. The radio-frequency coil 514 may also have multiple receive/transmit elements and the radio frequency transceiver 516 may have multiple receive/transmit channels. For example if a parallel imaging technique such as SENSE is performed, the radio-frequency could 514 will have multiple coil elements.

In this example the subject, 518 is positioned such that the subject's head region is within the region of interest 509. In other examples, other parts of the subject's 518 body may be positioned in the region of interest 509.

The transceiver 516 and the gradient controller 512 are shown as being connected to a hardware interface 306 of the computer system 302.

The memory 310 is further shown as containing initial pulse sequence commands 530 which are used to control the magnetic resonance imaging system 502 to acquire initial magnetic resonance imaging data 532. For example, the initial pulse sequence commands 530 could be used to acquire a low resolution or a survey scan. The memory 310 is further shown as containing the initial magnetic resonance imaging data 532 that was acquired by controlling the magnetic resonance imaging system 502 with the initial pulse sequence commands 530. The medical image 324 in this example was reconstructed from the initial magnetic resonance imaging data 532. In this example the further processing location 326 is a volume that was identified.

The location of the further processing location 326 is shown within the imaging zone 508. The further processing location 326 could for example be a plane or a volume used for labeling during an arterial spin labeling protocol. In another example the further processing location 326 could be a measurement location for an arterial input function for dynamic contrast-enhanced magnetic resonance imaging. In another example the further processing location 326 is a location for a single-voxel when performing magnetic resonance imaging spectroscopy.

The memory 310 is further shown as containing pulse sequence commands 534. The processor 324 uses the further processing location 326 to change the pulse sequence commands 534 into the modified pulse sequence commands 536. The modified pulse sequence commands 536 are then used to control the magnetic resonance imaging system 502 to acquire the magnetic resonance imaging data 538. The modified pulse sequence commands 536 and the magnetic resonance imaging data 538 are both shown as being stored in the memory 310. The memory 310 is further shown as containing a magnetic resonance image 540 that has been reconstructed from the magnetic resonance imaging data 538.

Figure 6:
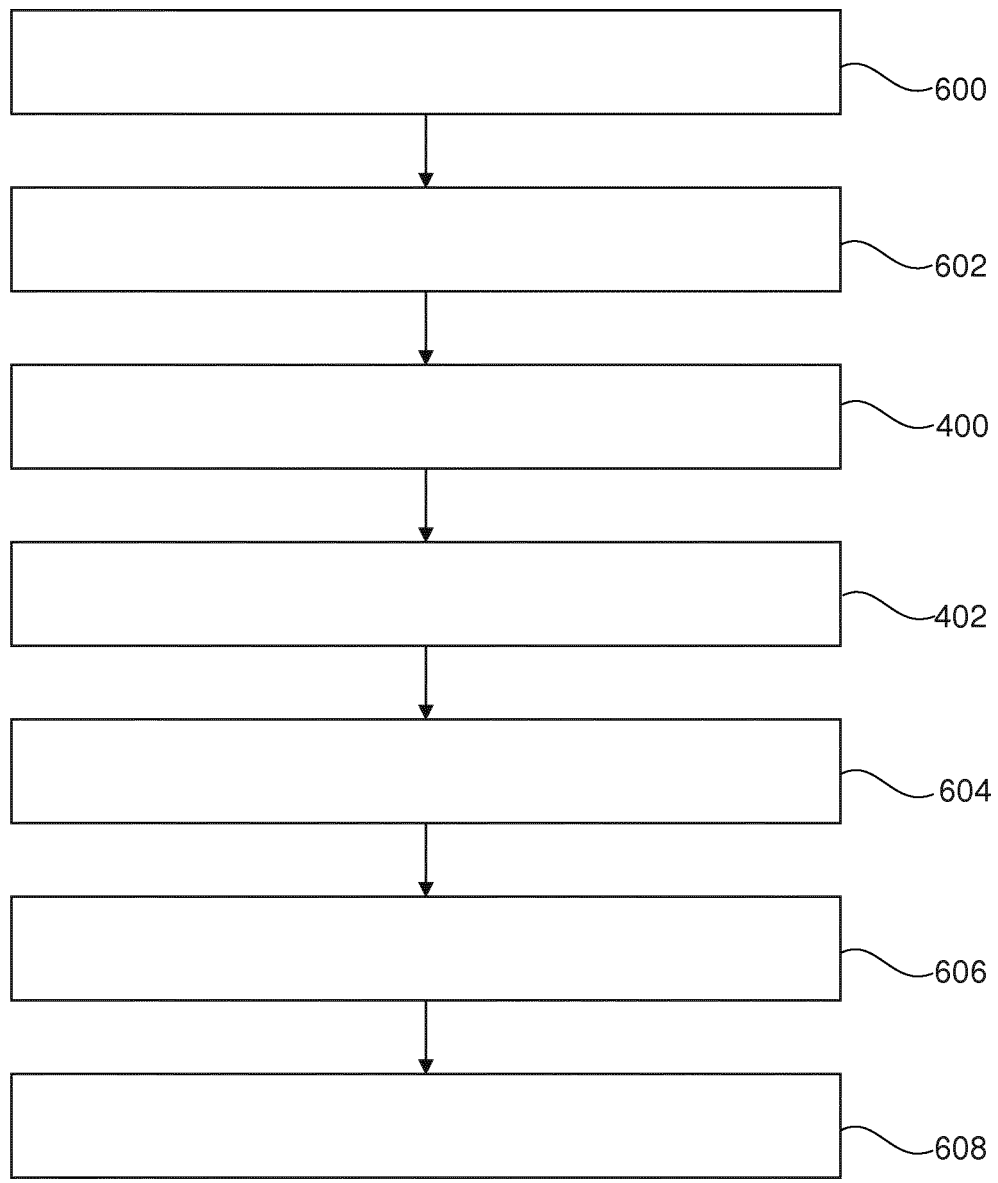
FIG. 6 shows a flow chart which illustrates a method of operating the medical imaging system of FIG. 5.

FIG. 6 shows a flowchart which illustrates a method of operating the medical imaging system 500 of FIG. 5. First in step 600 the magnetic resonance imaging system 502 is controlled with the initial pulse sequence commands 530 to acquire the initial magnetic resonance imaging data 532. Next in step 602 the medical image 324 is reconstructed from the initial magnetic resonance imaging data 532. Next the method proceeds to steps 400 and then 402 of the method illustrated in FIG. 2. After step 402 is performed method step 604 is performed. In step 604 the pulse sequence commands 534 are modified using the further processing location 326. Next in step 606 the modified pulse sequence commands 536 are used to control the magnetic resonance imaging system 502 to acquire the magnetic resonance imaging data 538. Finally, in step 608 the magnetic resonance image 540 is reconstructed from the magnetic resonance imaging data 538.

In arterial spin labelling (ASL), the image quality of the calculated perfusion maps is heavily dependent on the selection of the optimal labeling position in the pre-acquired angiography images. This is particularly crucial for selective ASL techniques, where careful selection of the arteries of interest is required for optimal labeling efficiency. Today, this task usually has to be carried out by the operator who has to rely on prior experience. This is not only a time-consuming task but can lead to low-quality results for less experienced users.

Examples may provide for automatic processing of this task. It may be based on a deep neural network 322 that is trained on a large number of annotated angiographic images 100. During application, it can automatically predict the optimal labeling positions as soon as the angiography data is available. It can either be used to provide suggested labeling positions to the operator, or as part of a fully automated ASL exam.

ASL in general relies on the utilization of arterial blood water spins as an endogenous tracer. The blood is being labeled proximal to the imaging region. After a certain time which is required for the blood to travel to the imaging region, the magnetically labeled spins exchange with tissue water molecules, thereby, reducing the overall tissue magnetization. The acquired (labeled) images are hence sensitized to the magnetic difference between labeled spins and static brain tissue. In order to achieve a purely perfusion-weighted signal, a second image acquisition (control) is needed, ideally without the blood magnetization being altered. Subsequent subtraction of both label and control images eliminates all static tissue signals and results in a pure perfusion-weighted image. To ensure sufficient signal-to-noise ratio (SNR), several pairs of label and control images are acquired (usually of the order of 5-30 pairs) which results in relatively long overall scan times of about 3 to 5 minutes.

In regular ASL imaging, the labeling plane is usually selected based on a pre-acquired angiography scan (most often time-of-flight (TOF) or phase contrast (PC) angiography). Ideally, the labeling plane should be placed such that it is perpendicular to all large feeding arteries. For many vascular anatomies, this is not possible, and the best compromise has to be chosen. Usually the operator chooses the best labeling position solely based on his/her prior experience.

In selective ASL, the blood is labeled only in individual arteries to allow for a visualization of the different perfusion territories in the brain. To this end, the operator has to select appropriate labeling positions such that only the arteries of interest and no adjacent vessels are labelled, e.g. by placing a labeling spot onto each artery. Apart from the vessel anatomy, a number of other influencing factors exist that control the efficiency of the selective labeling, such as blood flow velocity and vessel diameter. Those can alter due to vessel location, local vessel lumen, etc. Such influences may have an impact on different sequence parameter and the final image quality.

For selection of the labeling position 326, the operator typically takes all the above-mentioned factors into account. Moreover, the individual adaption of key labeling parameters such as selectivity/labeling gradient strengths, labeling duration, post-labeling delay etc. requires advanced technical knowledge of the operator and also quantitative values of specific entities, for instance blood flow velocity, vessel diameter etc. In total, these challenges can make the execution of an ASL scan a time-consuming task, and render the quality of the ASL scan heavily dependent on the operator's prior experience.

Examples may provide for a software tool 322 for automatic selection of the optimal labeling positions for ASL scans. It relies on a deep convolutional neural network 322 that takes angiographic images 324 as input and outputs an estimate of the best labeling positions (the further processing location 326). No input is required on part of the operator.

The proposed tool can be used for automatic selection of labeling positions both in non-selective and selective ASL scans. A detailed description for both applications is given in the following. A schematic overview of the proposed tool is depicted in FIGS. 7 and 8 below.

Figure 7:
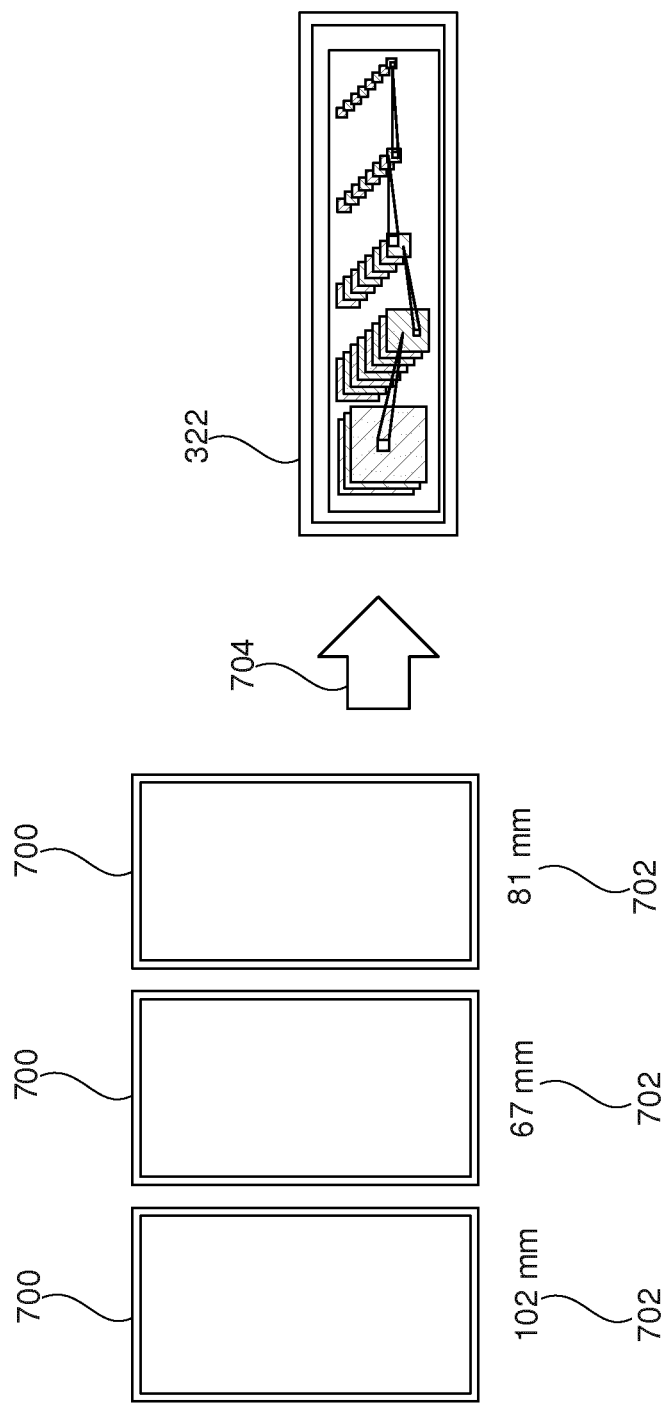
FIG. 7 illustrates an example method of training a neural network.

FIG. 7 illustrates graphically a training method. A number of training images 700 each with labels 702 are then used for training 704 the neural network 322.

FIG. 8 illustrates a use of the neural network 322. In this example a number of different medical images 324 are input into the neural network 322. As an output a number of label predictions 326 are received. These are equivalent to the further processing location 326.

The central components of the system of FIGS. 7 and 8 is a deep convolutional neural network 322. Realization of the tool consists of two steps:

During the training phase, the network is trained on a large dataset of image/label pairs, which consist of angiographic datasets and reference coordinates of the optimal labeling locations. For non-selective ASL, where the aim is to label all brain feeding vessels at once, the reference is given simply as the vertical coordinate of the optimal labeling plane position. For selective ASL, the reference is given as the full 3D coordinates of the optimal labeling positions for all arteries of interest. In both cases, if required, also the tilting angle of the labeling plane can be provided.

Several options exist for the generation of such a dataset:
  One or several experienced MR operators are given a large set of angiographic datasets, which are then annotated manually. Ideally, each dataset would be annotated multiple times by each operator, thereby reducing the impact of inter- and intra-observer variations.
  The image archive of an imaging department may be parsed for completed ASL scans. The employed labeling positions can then be extracted from the protocol files and exported along with the acquired angiography data. Ideally, this archive search would be restricted to ASL exams with high image quality, either by manual inspection or based on an automatic image quality assessment tool.

In both cases, data augmentation may be realized by small rotations and/or translations of the angiographic data combined with appropriate corrections of the reference labeling coordinates. In addition, performance of the network may be improved even during the clinical application by requesting operator input for difficult angiographic datasets, i.e. for angiograms where the labeling positions can only predict with low confidence, or in case of low ASL image quality.

The training itself is realized by optimizing the parameters of the convolutional neural network (weights and biases) using established techniques such as stochastic gradient descent to achieve the desired predictive capabilities.

During application, angiographic data is fed into the network directly after it is acquired. The network then automatically predicts the optimal labeling positions. This output may either be presented as suggestions to the operator, who can then modify the labeling positions manually if desired. Alternatively, the predicted labeling positions are directly used, i.e. the ASL scan can be executed in a fully automatic way.

In one example, the training dataset contains several possible labeling positions. The network then also predicts several possible labeling positions, along with a confidence score that represents the estimated quality of the labeling position choice. Only the top-scoring labeling positions may then be displayed to the user.

In another example, the network is trained to predict the optimal labeling positions based solely on 3D survey scan data (such as those acquired by the SmartExam product) or other non-angiographic imaging sequences and contrasts that cover the region in the body in which the arteries will be labeled. Here, the optimal labeling positions for the training dataset may still be generated based on acquired angiographic data, but the network is only trained on survey images or other non-angiographic contrasts. This allows for ASL exams without the lengthy acquisition of angiographic data.

In another example, the neural network 322 is trained to identify the location of relevant arteries in angiographic images 100 and, moreover, relevant information for selective ASL methods. This can be the distance between the vessels of interest in order to optimize the gradient strength for separating arteries in vessel-encoded ASL. The relevant information may also include the vessel lumen, curvature etc. which can be important in different approaches for selective labeling. To this end, this network is trained to determine the location of relevant arteries in angiographic images.

In another example, the network is trained to take into account vascular alterations due to vascular diseases and/or treatment (e.g. stents, etc.) that may have an impact on the labeling position and labeling efficiency, e.g. high-grade stenosis or occlusions. In this case, training data have to be provided by clinical partners.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 labeled medical image
102 truth processing location
104 truth processing location
106 truth processing location
108 most likely trial processing location
110 error vector
200 providing a labeled medical image, wherein the labeled medical image comprises multiple labels each indicating a truth processing location
202 inputting the labeled medical image into a neural network to obtain at least one trial processing location
204 determine the closest truth processing location for the most likely trial processing location
206 calculate an error vector using the closest truth processing location and the most likely trial processing location
208 train the neural network using the error vector
300 medical imaging system
302 computer
304 processor
306 optional hardware interface
308 optional user interface
310 memory
320 machine executable instructions
322 neural network
324 medical image
326 further processing location
328 optional brain fiber tracking algorithm
330 optional brain fiber tracking image
400 receive a medical image
402 input the medical image into the convolutional neural network and in response to the input receive a further processing location from the neural network
500 medical imaging system
502 magnetic resonance imaging system
504 magnet
506 bore of magnet
508 imaging zone
509 region of interest
510 magnetic field gradient coils
512 magnetic field gradient coil power supply
514 radio-frequency coil
516 transceiver
518 subject
520 subject support
530 initial pulse sequence commands
532 initial magnetic resonance imaging data
534 pulse sequence commands
536 modified pulse sequence commands
538 magnetic resonance imaging data
540 magnetic resonance image
600 control the magnetic resonance imaging system to acquire the initial magnetic resonance imaging data using the initial pulse sequence commands
602 reconstruct the medical image using the initial magnetic resonance imaging data
604 modify the pulse sequence commands using the further processing location
606 acquire the magnetic resonance imaging data by controlling the magnetic resonance imaging system with the modified pulse sequence commands
608 reconstruct a magnetic resonance image using the magnetic resonance imaging data
700 super-selective ASL
702 non-selective ASL
800 training images
802 labels
804 training

The invention claimed is:

1. A method of training a neural network configured for providing a further processing location, the method comprising:
providing a labeled medical image, wherein the labeled medical image comprises a plurality of labels indicating a plurality of truth processing locations, respectively;
inputting the labeled medical image into the neural network to obtain a most likely trial processing location as an output of the neural network;
determining a closest truth processing location of the plurality of truth processing locations for the most likely trial processing location, wherein the closest truth processing location is a closest of the plurality of truth processing locations to the output of the neural network;
calculating an error vector using the closest truth processing location and the most likely trial processing location, wherein the error vector is a position change between the closest truth processing location and the most likely trial processing location, wherein the error vector is calculated only using the closest truth processing location and the most likely trial processing location; and
training the neural network using the error vector.

2. The method of claim 1, wherein the method is performed repeatedly using multiple additional labeled medical images.

3. A medical imaging system comprising:
a memory for storing machine executable instructions and a neural network; and
a processor for controlling the medical imaging system, wherein execution of the machine executable instructions causes the processor to:
receive a labeled medical image for training the neural network, wherein the labeled medical image comprises a plurality of labels indicating a plurality of truth processing locations, respectively;
input the labeled medical image into the neural network to obtain a most likely trial processing location as an output of the neural network;
determine a closest truth processing location of the plurality of truth processing locations for the most likely trial processing location, wherein the closest truth processing location is a closest of the plurality of truth processing locations to the output of the neural network;
calculate an error vector using the closest truth processing location and the most likely trial processing location, wherein the error vector is a position change between the closest truth processing location and the most likely trial processing location, wherein the error vector is calculated only using the closest truth processing location and the most likely trial processing location; and
train the neural network using the error vector.

4. The medical imaging system of claim 3, wherein execution of the machine executable instructions further causes the processor to:
   receive a medical image; and
   input the medical image into the trained neural network to obtain a further processing location from the trained neural network.

5. The medical imaging system of claim 4, wherein the medical image is a diffusion-weighted magnetic resonance image of a brain, wherein the further processing region is a seed point and/or a region of interest size selection, wherein execution of the machine executable instructions further causes the processor to calculate a brain fiber tracking image by inputting the further processing region and the medical image into a brain fiber tracking algorithm.

6. The medical imaging system of claim 4, wherein execution of the machine executable instructions further causes the processor to:
   display the medical image on a user interface;
   receive a plurality of addition labels indicating a plurality of further truth processing locations, respectively, to provide a further labeled medical image; and
   further train the neural network by:
      inputting the further labeled medical image into the neural network to obtain at least one further trial processing location, wherein the at least one further trial processing location comprises a further most likely trial processing location;
      determining a further closest truth processing location for the further most likely trial processing location;
      calculating a further error vector using the further closest truth processing location and the further most likely trial processing location; and
      training the neural network using the further error vector.

7. The medical imaging system of claim 4, wherein the medical imaging system further comprises a magnetic resonance imaging system, wherein the memory further comprises pulse sequence commands configured for controlling the magnetic resonance imaging system to acquire magnetic resonance imaging data according to a magnetic resonance imaging protocol, wherein execution of the machine executable instructions further causes the processor to:
   modify the pulse sequence commands using the further processing location;
   control the magnetic resonance imaging system with the modified pulse sequence commands to acquire the magnetic resonance imaging data; and
   reconstruct a magnetic resonance image using the magnetic resonance imaging data.

8. The medical imaging system of claim 7, wherein the memory further comprises initial pulse sequence commands configured for controlling the magnetic resonance imaging system to acquire initial magnetic resonance imaging data, wherein execution of the machine executable instructions further causes the processor to:
   control the magnetic resonance imaging system to acquire the initial magnetic resonance imaging data using the initial pulse sequence commands; and
   reconstruct the medical image using the initial magnetic resonance imaging data.

9. The medical imaging system of claim 7, wherein the magnetic resonance imaging protocol is an arterial spin labelling protocol, wherein the further processing region is a labelling location.

10. The medical imaging system of claim 7, wherein the magnetic resonance imaging protocol is a Dynamic Contrast Enhanced magnetic resonance imaging protocol or a Dynamic Susceptibility Contrast perfusion magnetic resonance imaging protocol, wherein the further processing region is a measurement location for an arterial input function.

11. The medical imaging system of claim 7, wherein the magnetic resonance imaging protocol is single voxel magnetic resonance spectroscopy protocol, wherein the further processing region is a single voxel location for performing the single voxel magnetic resonance spectroscopy protocol.

12. The medical imaging system of claim 7, wherein the magnetic resonance imaging protocol is a phase-contrast magnetic resonance imaging protocol, wherein the further processing region is a slice position for performing the phase-contrast magnetic resonance imaging protocol.

13. The medical imaging system of claim 7, wherein the magnetic resonance imaging protocol is a contrast enhanced magnetic resonance angiography protocol, wherein the further processing region is a temporal region for triggering acquisition of the magnetic resonance imaging data.

14. A non-transitory computer readable medium storing machine executable instructions for execution by a processor controlling a medical imaging system, wherein execution of the machine executable instructions causes the processor to:
   receive a labeled medical image for training a neural network, wherein the labeled medical image comprises a plurality of labels indicating a plurality of truth processing locations, respectively;
   input the labeled medical image into the neural network to obtain a most likely trial processing location as an output of the neural network;
   determine the closest truth processing location of the plurality of truth processing locations for the most likely trial processing location, wherein the closest truth processing location is the closest of the truth processing locations to the output of the neural network;
   calculate an error vector using the closest truth processing location and the most likely trial processing location, wherein the error vector is a position change between the closest truth processing location and the most likely trial processing location, wherein the error vector is calculated only using the closest truth processing location and the most likely trial processing location; and
   train the neural network using the error vector.

15. The non-transitory computer readable medium of claim 14, wherein execution of the machine executable instructions further causes the processor to:
   receive a medical image; and
   input the medical image into the trained neural network to obtain a further processing location from the trained neural network.

16. The non-transitory computer readable medium of claim 15 further storing pulse sequence commands for controlling a magnetic resonance imaging system to acquire magnetic resonance imaging data according to a magnetic resonance imaging protocol, wherein execution of the machine executable instructions further causes the processor to:
   modify the pulse sequence commands using the further processing location;
   control the magnetic resonance imaging system with the modified pulse sequence commands to acquire the magnetic resonance imaging data; and
   reconstruct a magnetic resonance image using the magnetic resonance imaging data.

17. The non-transitory computer readable medium of claim 16 further storing initial pulse sequence commands for controlling the magnetic resonance imaging system to acquire initial magnetic resonance imaging data, wherein execution of the machine executable instructions further causes the processor to:
- control the magnetic resonance imaging system to acquire the initial magnetic resonance imaging data using the initial pulse sequence commands; and
- reconstruct the medical image using the initial magnetic resonance imaging data.

18. The non-transitory computer readable medium of claim 16, wherein the magnetic resonance imaging protocol is an arterial spin labelling protocol, wherein the further processing region is a labelling location.

19. The non-transitory computer readable medium of claim 16, wherein the magnetic resonance imaging protocol is a Dynamic Contrast Enhanced magnetic resonance imaging protocol or a Dynamic Susceptibility Contrast perfusion magnetic resonance imaging protocol, wherein the further processing region is a measurement location for an arterial input function.

20. The non-transitory computer readable medium of claim 16, wherein the magnetic resonance imaging protocol is a single voxel magnetic resonance spectroscopy protocol, wherein the further processing region is a single voxel location for performing the single voxel magnetic resonance spectroscopy protocol.

* * * * *